United States Patent
Park et al.

(10) Patent No.: US 10,043,830 B2
(45) Date of Patent: Aug. 7, 2018

(54) THIN FILM TRANSISTOR CIRCUIT DEVICE AND METHOD OF MANUFACTURING THE SAME

(71) Applicant: Samsung Display Co., Ltd., Yongin-si, Gyeonggi-do (KR)

(72) Inventors: Sun Park, Yongin-si (KR); Jeonghwan Kim, Yongin-si (KR); Wonho Jang, Yongin-si (KR); Joohyeon Jo, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/864,451

(22) Filed: Sep. 24, 2015

(65) Prior Publication Data

US 2016/0190164 A1   Jun. 30, 2016

(30) Foreign Application Priority Data

Dec. 30, 2014  (KR) .......................... 10-2014-0193821

(51) Int. Cl.
*H01L 21/00* (2006.01)
*H01L 27/12* (2006.01)

(52) U.S. Cl.
CPC ........ *H01L 27/124* (2013.01); *H01L 27/1222* (2013.01)

(58) Field of Classification Search
CPC .............. H01L 27/124; H01L 27/1222; H01L 27/1259
See application file for complete search history.

(56) References Cited

U.S. PATENT DOCUMENTS

| | | | |
|---|---|---|---|
| 7,652,740 B2 * | 1/2010 | Hwang | ............. G02F 1/136286 349/138 |
| 8,330,354 B2 | 12/2012 | Lim et al. | |
| 8,501,614 B1 | 8/2013 | Shih et al. | |
| 8,624,246 B2 * | 1/2014 | You | ..................... H01L 27/1288 257/40 |

(Continued)

FOREIGN PATENT DOCUMENTS

| | | |
|---|---|---|
| KR | 10-2004-0106806 A | 12/2004 |
| KR | 10-2007-0116475 A | 12/2007 |

(Continued)

*Primary Examiner* — Laura Menz
(74) *Attorney, Agent, or Firm* — Knobbe Martens Olson & Bear LLP

(57) ABSTRACT

A thin film transistor (TFT) circuit device comprises a substrate comprising a major surface; a gate line formed over the substrate and extending in a first direction when viewed in a viewing direction perpendicular to the major surface; an insulating layer formed over the gate line; an electrically conductive line formed over the insulating layer and extending in a second direction when viewed in the viewing direction, the second direction being different from the first direction, the electrically conductive line comprising a source line or a data line; and a semiconductor piece formed over the substrate. The semiconductor piece comprises a portion which is located between the substrate and the gate line and overlaps the gate line and the electrically conductive line at an intersection of the gate line and the electrically conductive line when viewed in the viewing direction.

20 Claims, 4 Drawing Sheets

(56) References Cited

U.S. PATENT DOCUMENTS

| | | | |
|---|---|---|---|
| 9,224,764 B2* | 12/2015 | Kim | H01L 27/1262 |
| 9,847,055 B2* | 12/2017 | Kim | G09G 3/3225 |
| 2002/0109811 A1* | 8/2002 | Park | G02F 1/136227 |
| | | | 349/113 |
| 2003/0059986 A1* | 3/2003 | Shibata | G02F 1/136209 |
| | | | 438/149 |
| 2004/0004220 A1* | 1/2004 | Suzuki | H01L 29/42384 |
| | | | 257/66 |
| 2004/0126917 A1* | 7/2004 | Yoo | H01L 27/1214 |
| | | | 438/30 |
| 2004/0135520 A1* | 7/2004 | Park | H01L 27/3253 |
| | | | 315/169.3 |
| 2007/0272982 A1* | 11/2007 | Sato | G02F 1/13454 |
| | | | 257/347 |
| 2007/0278487 A1 | 12/2007 | Choung et al. | |
| 2011/0156165 A1* | 6/2011 | Jang | G02F 1/136213 |
| | | | 257/389 |
| 2012/0092313 A1* | 4/2012 | Choi | H01L 27/3276 |
| | | | 345/206 |
| 2013/0056724 A1 | 3/2013 | Chae et al. | |
| 2015/0162363 A1* | 6/2015 | Kim | H01L 27/1262 |
| | | | 257/72 |
| 2015/0303123 A1* | 10/2015 | Choi | H01L 23/3192 |
| | | | 257/72 |
| 2016/0190164 A1* | 6/2016 | Park | H01L 27/124 |
| | | | 257/72 |

FOREIGN PATENT DOCUMENTS

| | | |
|---|---|---|
| KR | 10-2008-0071751 A | 8/2008 |
| KR | 10-2013-0025802 A | 3/2013 |

* cited by examiner

THIN FILM TRANSISTOR CIRCUIT DEVICE AND METHOD OF MANUFACTURING THE SAME

RELATED APPLICATION

This application claims the benefit of Korean Patent Application No. 10-2014-0193821, filed on Dec. 30, 2014, in the Korean Intellectual Property Office, the disclosure of which is incorporated herein in its entirety by reference.

BACKGROUND

1. Field

The present disclosure relates to a thin film transistor array substrate and a method of manufacturing the same.

2. Description of the Related Art

A flat display apparatus, such as an organic light-emitting display apparatus and a liquid crystal display (LCD) apparatus, includes thin film transistors (TFTs), capacitors, and wires that connect the TFTs and the capacitors.

The wirings may include gate lines, active lines, and source lines. The gate lines and the source lines may cross each other. However, since the wires are not all formed on the same layer, some of the wires may be stacked on top of each other. In this case, a short may occur between overlapping wires and thus defects may occur therein.

SUMMARY

One or more embodiments include a thin film transistor (TFT) array substrate and a method of manufacturing the same.

Additional aspects will be set forth in part in the description which follows and, in part, will be apparent from the description, or may be learned by practice of the presented embodiments.

One aspect of the invention provides a thin film transistor (TFT) circuit device, which may comprise: a substrate comprising a major surface; a gate line formed over the substrate and extending in a first direction when viewed in a viewing direction perpendicular to the major surface; an insulating layer formed over the gate line; an electrically conductive line formed over the insulating layer and extending in a second direction when viewed in the viewing direction, the second direction being different from the first direction, the electrically conductive line comprising a source line or a data line; and a semiconductor piece formed over the substrate, the semiconductor piece comprising a portion which is located between the substrate and the gate line and overlaps the gate line and the electrically conductive line at an intersection of the gate line and the electrically conductive line when viewed in the viewing direction.

In the foregoing device, the device may further comprise a gate insulating layer located between the semiconductor piece and the gate line. The gate line may comprise an edge overlapping the electrically conductive line when viewed in the viewing direction, wherein the edge of the gate line overlaps the semiconductor piece when viewed in the viewing direction. The semiconductor piece may comprise two edges overlapping the electrically conductive line when viewed in the viewing direction, wherein the edge of the gate line is located between the two edges of the semiconductor piece when viewed in the viewing direction. The semiconductor piece may comprise another portion that overlaps the electrically conductive line and does not overlap the gate line. The electrically conductive line may comprise a stepped portion generally conforming to a stepped structure formed by the gate line and the semiconductor piece.

Still in the foregoing device, the gate line may comprise two edges overlapping the electrically conductive line when viewed in the viewing direction, wherein the two edges overlap the semiconductor piece when viewed in the viewing direction. The semiconductor piece is formed under the gate line, and has a width is substantially greater than that of the gate line. The semiconductor piece may be formed of polysilicon. The device may further comprise a semiconductor layer portion at least partially doped with impurities for providing source and drain areas of a TFT. The semiconductor piece may be formed of a material the same as that of the semiconductor layer portion and does not comprise a portion doped with the impurities, wherein the semiconductor piece is not electrically connected to the semiconductor layer portion. The semiconductor piece may have a thickness substantially smaller than that of the gate line. The semiconductor piece may be insulated from the gate line and the electrically conductive line.

Another aspect of the invention provides a method of manufacturing a thin film transistor (TFT) circuit device, which may comprise: forming, over a substrate comprising a major surface, a semiconductor layer portion of a TFT, and a semiconductor piece; forming a gate line over the substrate to cover at least a portion of the semiconductor layer portion and at least a portion of the semiconductor piece when viewed in a viewing direction perpendicular to the major surface, the gate line extending in a first direction when viewed in the viewing direction; and forming an electrically conductive line over the substrate, the electrically conductive line extending in a second direction when viewed in the viewing direction, the second direction being different from the first direction, the electrically conductive line comprising a source line or a data line, wherein the semiconductor piece comprises a portion that overlaps the gate line and the electrically conductive line at an intersection of the gate line and the electrically conductive line when viewed in the viewing direction.

In the foregoing method, the method may further comprise, after the forming of the gate line and before the forming of the electrically conductive line, forming an insulating layer that insulates the gate line from the electrically conductive line. Forming the semiconductor layer portion and the semiconductor piece may comprise: forming a semiconductor material layer over the substrate; and patterning the semiconductor material layer, thereby forming the semiconductor layer portion and the semiconductor piece. The gate line may comprise an edge overlapping the electrically conductive line when viewed in the viewing direction, wherein the edge of the gate line overlaps the semiconductor piece when viewed in the viewing direction. The semiconductor piece may comprise two edges overlapping the electrically conductive line when viewed in the viewing direction, wherein the edge of the gate line is located between the two edges of the semiconductor piece when viewed in the viewing direction. The semiconductor piece may be formed under the gate line, and has a width is substantially greater than that of the gate line. The gate line may comprise two edges overlapping the electrically conductive line when viewed in the viewing direction, wherein the two edges overlap the semiconductor piece when viewed in the viewing direction.

According to one or more embodiments, a TFT array substrate includes a substrate, a gate line formed on the substrate, a wiring insulating layer formed on the gate line, and a source or data line formed on the wiring insulating layer. A semiconductor pattern is formed under the gate line at an intersection of the gate line and the source or data line.

The TFT array substrate may further include a gate insulating layer between the semiconductor pattern and the gate line.

The semiconductor pattern may be formed at an edge of the gate line, and the edge of the gate line may be stair shaped.

The source or data line may be stair shaped at the edge of the gate line.

The gate line may have two edges, the semiconductor pattern may be formed at both edges of the gate line, and both edges of the gate line may be stair shaped.

The semiconductor pattern may be formed under the gate line, and a width of the semiconductor pattern may be equal to a width of the gate line.

The semiconductor layer may be formed of polysilicon.

According to one or more embodiments, a method of manufacturing a TFT substrate includes forming, on a substrate, a semiconductor layer of the TFT, and a semiconductor pattern at an intersection of a gate line and a source or data line, forming the gate line on the substrate to cover the semiconductor layer and the semiconductor pattern, and forming the source or data line to intersect with the gate line.

The method may further include, after the forming of the gate line and before the forming of the source or data line, forming a wiring insulating layer that insulates the gate line from the source or data line.

The semiconductor pattern may be formed by the semiconductor layer underneath the gate line at the intersection of the gate line and the source or data line.

The semiconductor pattern may be formed at an edge of the gate line, and the edge of the gate line may be stair shaped.

The source or data line may be stair shaped and formed at the edge of the gate line.

The semiconductor pattern may be formed under the gate line, and a width of the semiconductor pattern may be equal to a width of the gate line.

The gate line may have two edges, the semiconductor pattern may be formed at both edges of the gate line, and both edges of the gate line may be stair shaped.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
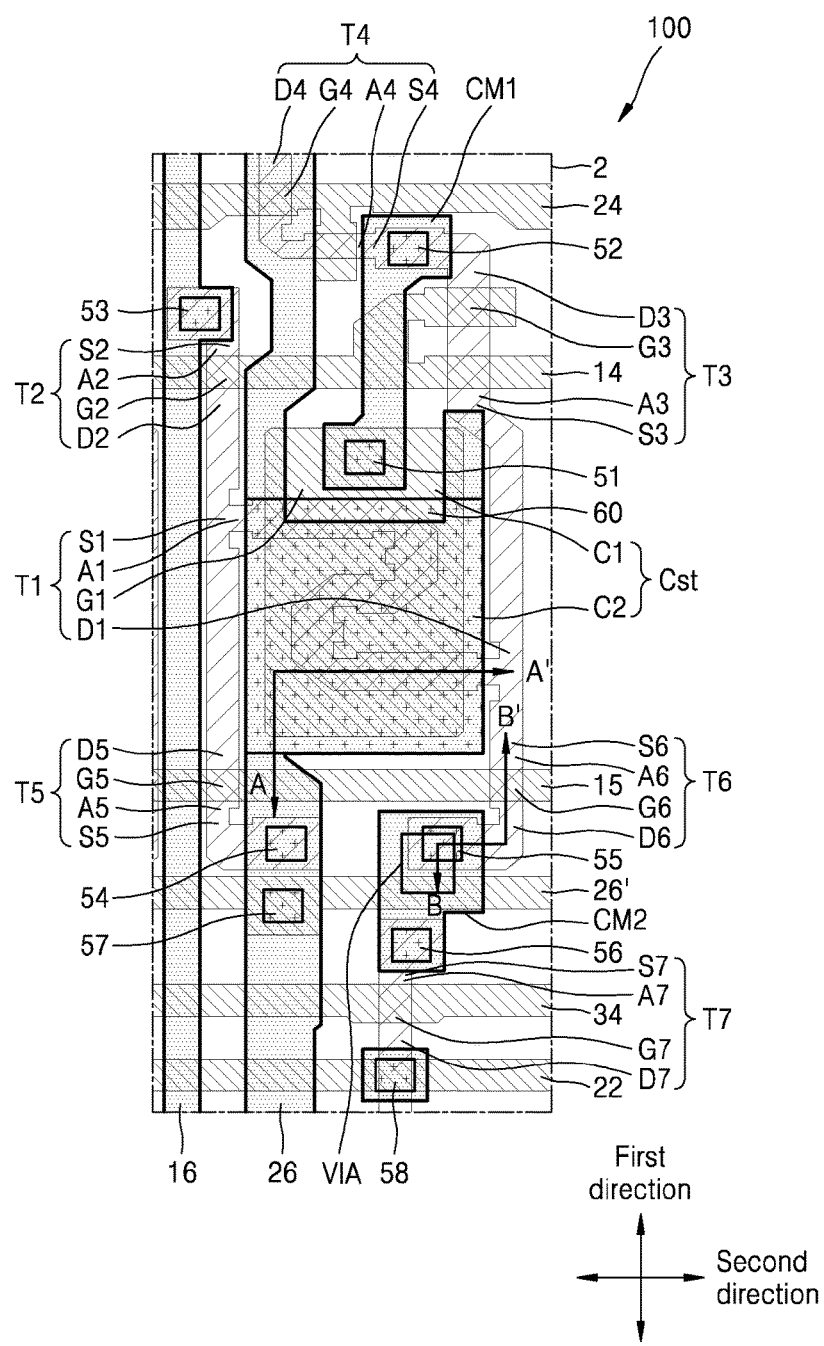
FIG. 1 is a plan view schematically illustrating a pixel circuit of a thin film transistor (TFT) array substrate according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

In embodiments, a display device includes an array of pixels. Each of the pixels is connected to a pixel circuit including one or more one or more thin film transistors. In embodiments, when manufacturing a display device, pixel circuits are formed over a substrate plate, thereby forming a pixel circuit array substrate or a TFT substrate including an array of pixel circuits. And, an array of pixels is formed over the TFT substrate. FIG. 1 is a plan view schematically illustrating a pixel circuit 2 of a thin film transistor (TFT) array substrate 1000 according to an embodiment. The pixel circuit 2 shown in FIG. 1 is only an embodiment, and the pixel circuit 2 is not limited thereto.

The TFT array substrate 1000 refers to a substrate including at least one TFT. According to the embodiments of the present specification, the TFT array substrate 1000 refers to a case where a plurality of TFTs are arranged in an array, but the present invention is not limited thereto. In a TFT substrate according to an alternative embodiment, the plurality of TFTs are not arranged in an array. In a TFT substrate according to another alternative embodiment, only one TFT may be provided therein.

According to embodiments, the TFT array substrate 1000 may be applied to a display apparatus. The display apparatus may be, but is not limited to, an organic light-emitting display apparatus, a liquid crystal display (LCD) apparatus, an electrophoretic display apparatus, and a plasma display apparatus.

Referring to FIG. 1, a driving TFT T1, a data transmission TFT T2, a compensation TFT T3, a first initialization TFT T4, a first emission control TFT T5, a second emission control TFT T6, a second initialization TFT T7, and a storage capacitor Cst may be formed in the pixel circuit 2.

The driving TFT T1 includes a driving semiconductor layer A1, a driving gate electrode G1, a driving source electrode S1, and a driving drain electrode S1. The driving source electrode S1 is a driving source area in the driving semiconductor layer A1 which is doped with impurities, and the driving drain electrode S1 is a driving drain area in the driving semiconductor layer A1 which is doped with impurities. An area in the driving semiconductor layer A1 between the driving source area and the driving drain area is a driving channel area. The driving gate electrode G1, a compensation drain electrode D3, and a first initialization source electrode S4 are connected by a first contact metal CM1 via a first contact hole 51 and a second contact hole 52.

The data transmission TFT T2 includes a data transmission semiconductor layer A2, a data transmission gate electrode G2, a data transmission source electrode S2, and a data transmission drain electrode D2. The data transmission source electrode S2 is a switching source area in the data transmission semiconductor layer A2 which is doped with impurities, and the data transmission drain electrode D2 is a switching drain area in the data transmission semiconductor layer A2 which is doped with impurities. The data transmission source electrode S2 is connected to a data line 16 via a third contact hole 53. The data transmission drain electrode D2 is connected to the driving TFT T1 and the first emission control TFT T5. The data transmission gate electrode G2 is formed as a portion of a first scan line 14.

The compensation TFT T3 includes a compensation semiconductor layer A3, a compensation gate electrode G3, a compensation source electrode S3, and the compensation drain electrode D3. The compensation source electrode S3 is a compensation source area in the compensation semiconductor layer A3 which is doped with impurities, and the compensation drain electrode D3 is a compensation drain area in the compensation semiconductor layer A3 which is doped with impurities.

The first initialization TFT T4 includes a first initialization semiconductor layer A4, a first initialization gate electrode G4, the first initialization source electrode S4, and a first initialization drain electrode D4. The first initialization source electrode S4 is a first initialization source area in the first initialization semiconductor layer A4 which is doped with impurities, and the first initialization drain electrode D4 is a first initialization drain area in the first initialization semiconductor layer A4 which is doped with impurities. The first initialization drain electrode D4 is connected to the second initialization TFT T7, and the first initialization source electrode S4 is connected to the driving gate electrode G1 and a first electrode C1 of the storage capacitor Cst via the first and second contact holes 51 and 52 in which the first contact metal CM1 is formed. The first initialization gate electrode G4 is formed as a portion of a second scan line 24. A dual gate electrode structure is formed by the first initialization gate electrode G4 and a portion of a wiring protruding from the second scan line 24.

The first emission control TFT T5 includes a first emission control semiconductor layer A5, a first emission control gate electrode G5, a first emission control source electrode S5, and a first emission control drain electrode D5. The first emission control source electrode S5 is a first emission control source area in the first emission control semiconductor layer A5 which is doped with impurities, and the first emission control drain electrode D5 is a first emission control drain area in the first emission control semiconductor layer A5 which is doped with impurities. The first emission control source electrode S5 is connected to a driving voltage line 26 via a fourth contact hole 54. The first emission control gate electrode G5 is formed as a portion of an emission control line 15.

The second emission control TFT T6 includes a second emission control semiconductor layer A6, a second emission control gate electrode G6, a second emission control source electrode S6, and a second emission control drain electrode D6. The second emission control source electrode S6 is a second emission control source area in the second emission control semiconductor layer A6 which is doped with impurities, and the second emission control drain electrode D6 is a second emission control drain area in the second emission control semiconductor layer A6 which is doped with impurities. The second emission control drain electrode D6 is connected to a pixel electrode of an organic light-emitting device (OLED) via a second contact metal CM2 connected through a fifth contact hole 55 and a via hole VIA that is connected to the second contact metal CM2. The second emission control gate electrode G6 is formed as a portion of an emission control line 15.

The second initialization TFT T7 includes a second initialization semiconductor layer A7, a second initialization gate electrode G7, a second initialization source electrode S7, and a second initialization drain electrode D7. The second initialization source electrode S7 is a second initialization source area in the second initialization semiconductor layer A7 which is doped with impurities, and the second initialization drain electrode D7 is a second initialization drain area in the second initialization semiconductor layer A7 which is doped with impurities. The second initialization drain electrode D7 is connected to an initialization voltage line 22 via an eighth contact hole 58. The second initialization source electrode S7 is connected to a pixel electrode of the OLED via the second contact metal CM2 connected through a sixth contact hole 56 and the via hole VIA that is connected to the second contact metal CM2. The second initialization gate electrode G7 is formed as a portion of a third scan line 34.

An embodiment of the TFT array substrate 1000 including TFTs is described with reference to FIG. 1.

Figure 2:
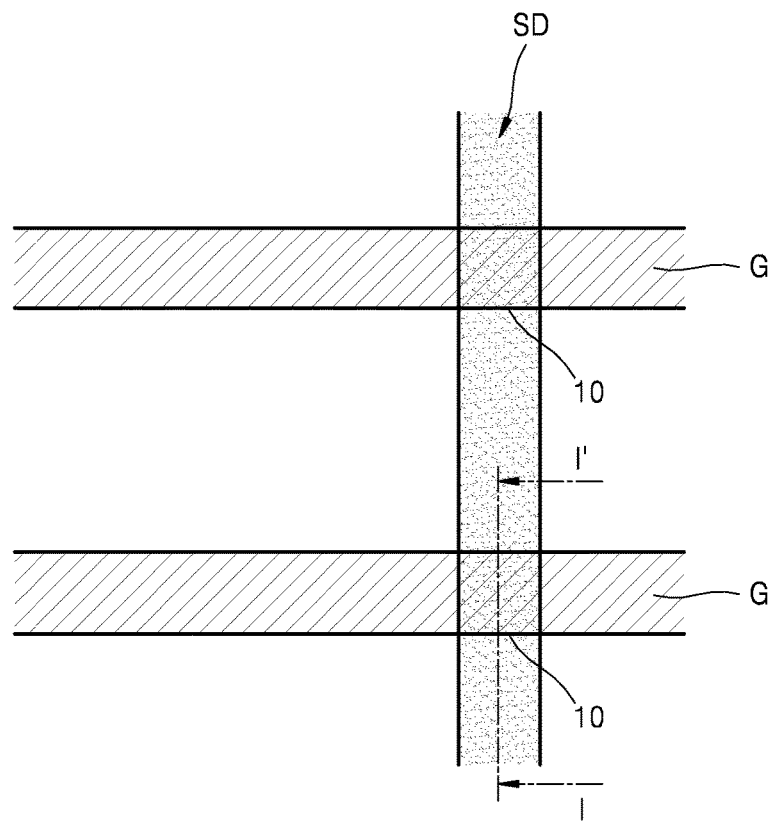
FIG. 2 is a simplified diagram illustrating wires arranged in a portion of a TFT array substrate where a TFT has not been formed, according to an embodiment.

FIG. 2 is a simplified diagram illustrating wires arranged in a portion of a TFT array substrate where a TFT has not been formed, according to an embodiment. The wires are formed over a substrate panel including a major surface.

As shown in FIGS. 1 and 2, a gate line G may intersect with an electrically conductive line SD which may be a source line or a data line. Thus, in this specification, the electrically conductive line SD may be referred to as the "source or date line SD." A source line and a gate line may be formed on different layers, and may overlap each other when viewed in a direction perpendicular to a major surface of a substrate panel.

In this case, due to the respective heights of the gate line G and the source or data line SD, defects may occur due to a step formed between the gate line G and the source or data line SD at an intersection of the gate line G and the source or data line SD.

In other words, when an edge 10 of the gate line G is not sloped but is perpendicular to the TFT array substrate, the source or data line SD over the gate line G is formed such that an edge thereof is perpendicular to the TFT array substrate.

In this case, a step coverage defect occurs due to a large step formed by a portion of the source or data line SD over the gate line G and other portions of the source or data line SD not over the gate line G, and thus, a wiring defect may occur.

The step coverage defect of the step formed in the wiring may also cause other problems in addition to the wiring defect.

Figure 3:
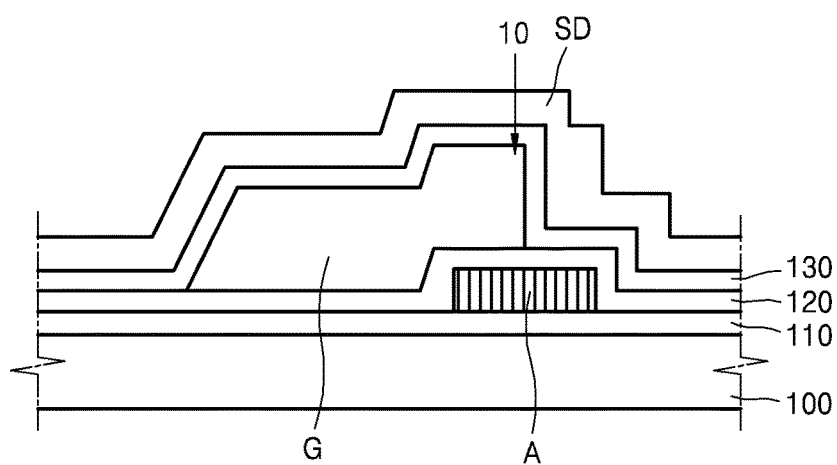
FIG. 3 is a cross-sectional view schematically illustrating the TFT array substrate cut along line I-I' of FIG. 2.

FIG. 3 is a cross-sectional view schematically illustrating the TFT array substrate cut along line I-I' of FIG. 2.

As in FIG. 2, FIG. 3 illustrates a portion of a TFT array substrate where a TFT has not been formed. Components described below are not related to components of the TFT.

Referring to FIG. 3, a buffer layer 110 may be formed on a substrate 100. The buffer layer 110 may prevent or inhibit ion impurities from spreading, block moisture or external air, and function as a barrier layer and/or a blocking layer for planarizing the surface of the substrate 100.

A semiconductor portion or piece A may be formed on the buffer layer 110. The semiconductor piece A may be formed during a process of manufacturing the semiconductor layers (A1 to A7) of the TFT described above with reference to FIG. 1. Accordingly, the semiconductor piece A may be formed on the same layer as any of the semiconductor layers (A1 to A7) of the TFT.

Therefore, both the semiconductor piece A and the semiconductor layers (A1 to A7) of the TFT may be formed of polysilicon. However, the semiconductor piece A according to the present embodiment may differ from the semiconductor layers (A1 to A7) of the TFT with respect to location and function.

As shown in FIG. 3, the semiconductor piece A may be formed at an edge 10 of a gate line G. The semiconductor piece A will be described in detail later regarding respective locations of the gate line G and a source or data line SD.

A gate insulating layer 120 is stacked over the entire surface of the substrate 100 to cover the semiconductor piece A. The gate insulating layer 120 may be a single layer or a plurality of layers formed of an inorganic material such as silicon oxide or silicon nitride. The gate insulating layer 120 insulates the semiconductor piece A from the gate line G.

The gate line G may be formed on the gate insulating layer 120. The gate line G may be formed of at least one material selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), nickel (Li), calcium (Ca), titanium (Ti), tungsten (W), and copper (Cu).

A wiring insulating layer 130 may be formed over the entire surface of the substrate 100 to cover the gate line G.

The wiring insulating layer 130 may be formed of an inorganic material or an organic material. In some embodiments, the wiring insulating layer 130 may be formed of an inorganic material, for example, metal oxide or metal nitride, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). In some embodiments, the wiring insulating layer 130 may be formed of a material having a dielectric constant between about 4 and about 7.

The wiring insulating layer 130 may be a single layer or a plurality of layers formed of an inorganic material such as $SiO_x$ and/or $SiN_x$. In some embodiments, the wiring insulating layer 130 may have a dual structure of $SiO_x/SiN_y$ or $SiN_x/SiO_y$.

The wiring insulating layer 130 may insulate the gate line G from the source or data line SD formed on the wiring insulating layer 130.

As described above, in the case that the edge 10 of the gate line G is perpendicular to the substrate 100 and the wiring insulating layer 130 and the source or data line SD are sequentially formed over the gate line G, a wiring defect may occur due to a step formed at the edge 10 of the gate line G.

Therefore, the semiconductor piece A may be formed under the gate line G, at an intersection of the gate line G and the source or data line SD.

In the TFT array substrate according to the present embodiment, the semiconductor piece A may be formed under the edge 10 of the gate line G, as shown in FIG. 3.

The edge 10 of the gate line G may be stair shaped due to the semiconductor piece A.

In addition, since the wiring insulating layer 130 is stacked over the gate line G, the wiring insulating layer 130 may be formed according to a structure below the same. In embodiments, the wiring insulating layer 130 may be stair shaped at the edge 10 of the gate line G due to the semiconductor piece A formed under the gate line G. Furthermore, the wiring insulating layer 130 at an outer side of the gate line G is not formed as stairs that sharply increase in height, but as stairs that gradually increase in height.

At the intersection of the gate line G and the source or data line SD, the wiring insulating layer 130 is formed as stairs that gradually increase in height, and thus the source or data line SD formed on the wiring insulating layer 130 may also be formed as stairs.

In embodiments, as shown in FIG. 3, since the semiconductor piece A is located at the edge 10, portions of the source or data line SD above the gate line G and the outer sides of the gate line G may be stair shaped. Therefore, the source or wiring SD may be formed as stairs that gradually increase in height rather than stairs that sharply increase in height.

As described above, the TFT array substrate according to the present embodiment may reduce or minimize wiring defects that would otherwise occur due to a large step formed by the gate line G and a portion of the source or data line SD over the gate line G when the edge 10 of the gate line G is perpendicular to the substrate 100 at the intersection of the gate line G and the source or data line SD.

In embodiments, the semiconductor piece A is formed under the edge 10 of the gate line G at the intersection of the gate line G and the source or data line SD so that the gate line G, the wiring insulating layer 130, and the source or data line SD are formed to the left and right of the semiconductor piece A as stairs that gradually increase in height.

Figure 4:
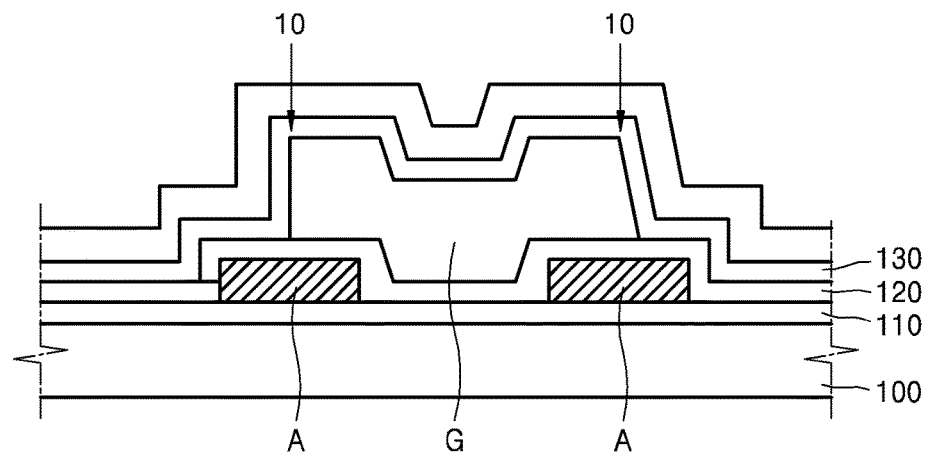
FIG. 4 is a cross-sectional view illustrating a TFT array substrate according to another embodiment.

FIG. 4 is a cross-sectional view illustrating a TFT array substrate according to another embodiment. In FIG. 4, reference numerals that are the same as in FIG. 3 refer to the same elements, and descriptions of the same elements will be omitted for the sake of brevity.

Referring to FIG. 4, the semiconductor piece A may be formed at not only one edge, but at two edges 10 of the gate line G. This is because the two edges 10 of the gate line G may both be perpendicular to the substrate 100 and thus a wiring defect may occur at both sides of the gate line G.

As in the above-described embodiment, in the TFT array substrate according to the present embodiment, the gate line G, the wiring insulating layer 130, and the source or data line SD may be formed over the semiconductor piece A as stairs at left and right sides of the edge 10.

Therefore, a wiring defect may not occur at the two edges 10 of the gate line G formed at the intersections of the gate line G and the source or data line SD.

Figure 5:
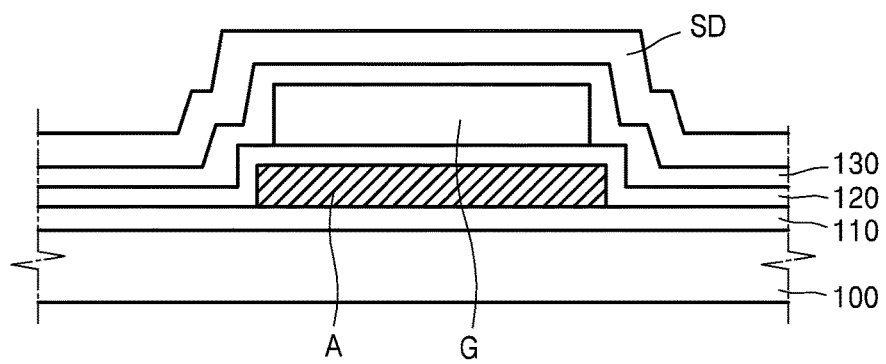
FIG. 5 is a cross-sectional view illustrating a TFT array substrate according to another embodiment.

FIG. 5 is a cross-sectional view illustrating a TFT array substrate according to another embodiment. In FIG. 5, reference numerals that are the same as in those of FIG. 3 refer to the same elements, and descriptions of the same elements will be omitted for the sake of brevity.

Referring to FIG. 5, the semiconductor piece A may be formed under the gate line G such that a width of the semiconductor piece A is equal to or greater than that of the gate line G.

The semiconductor piece A may be formed under the edge 10 of the gate line G, and also under the entire bottom surface of the gate line G. Therefore, the source or data line SD is formed as stairs that gradually increase in height.

As described above, the semiconductor piece A according to the present embodiment is formed at the intersection of the gate line G and the source or data line SD to reduce the size of each step and thereby reducing or minimizing the occurrence of a wiring defect.

Figure 6A:
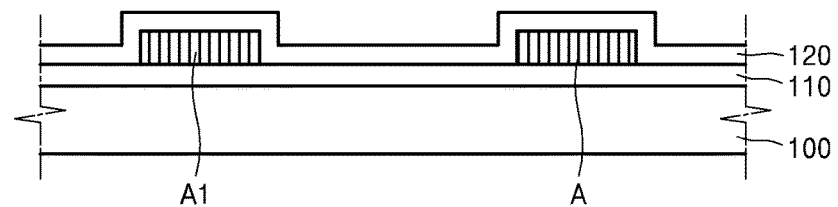
FIGS. 6A to 6C are cross-sectional views illustrating a method of manufacturing a TFT array substrate, according to an embodiment.
Figure 6B:
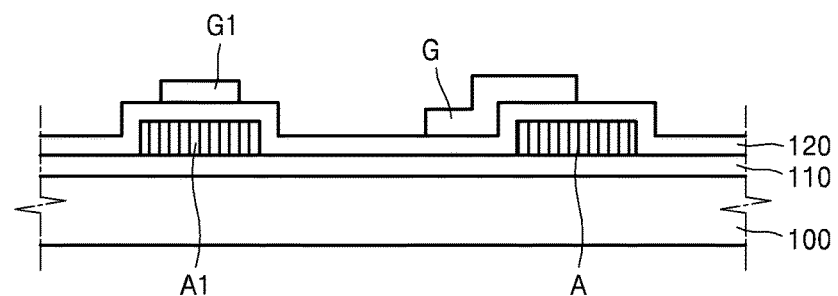
Figure 6C:
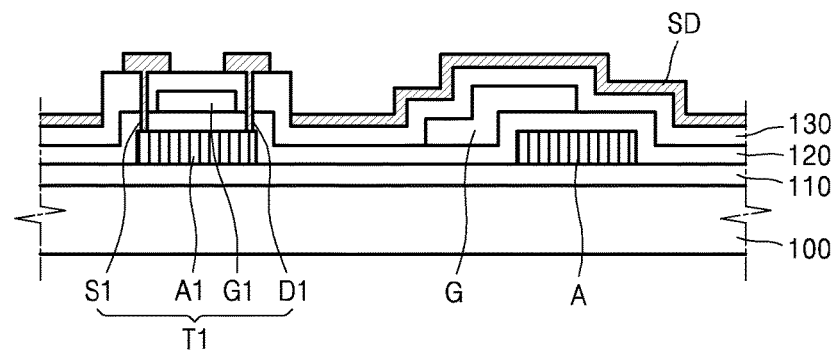

FIGS. 6A to 6C are cross-sectional views illustrating a method of manufacturing a TFT array substrate, according to an embodiment. FIGS. 6A to 6C illustrate a method of manufacturing the TFT array substrate shown in FIG. 3. Although the present embodiment describes only the driving TFT T1 from among the plurality of TFTs (T1 to T7) for convenience of description, the present embodiment is not limited thereto.

Referring to FIG. 6A, the buffer layer 110 and the plurality of TFTs may be formed over the substrate 100. First, the driving semiconductor layer A1 of the driving TFT T1 is formed, and the semiconductor piece A may be formed at the same time with the driving semiconductor layer A1.

The driving semiconductor layer A1 and the semiconductor piece A may be formed of a semiconductor including amorphous silicon or crystalline silicon, and deposited by using various deposition methods. Crystalline silicon may be formed by crystallizing amorphous silicon. A method of crystallizing amorphous silicon may include rapid thermal annealing (RTA), solid phase crystallization (SPC), excimer laser annealing (ELA), metal induced crystallization (MIC), metal induced lateral crystallization (MILC), and sequential lateral solidification (SLS). The driving semiconductor layer A1 and the semiconductor piece A may be patterned by photolithography.

The semiconductor piece A may be formed at the intersection of the gate line G and the source or data line SD at the edge 10 of the gate line G.

The gate insulating layer 120 insulates the driving semiconductor layer A1 and the semiconductor piece A from the driving gate electrode G1 and the gate line G. The gate insulating layer 120 is formed over the entire surface of the substrate 100 to cover the driving semiconductor layer A1 and the semiconductor piece A.

The gate insulating layer 120 may be formed of an organic or an inorganic insulating material. In some embodiments, the gate insulating layer 120 may be formed of $SiN_x$, $SiO_2$, $HfO_2$, or $Al_2O_3$. The gate insulating layer 120 may be formed by using various deposition methods, such as sputtering, chemical vapor deposition (CVD), or plasma enhanced chemical vapor deposition (PECVD).

Referring to FIG. 6B, the driving gate electrode G1 is formed on the gate insulating layer 120 such that the driving gate electrode G1 overlaps at least a portion of the driving semiconductor layer A1. Also, the gate line G may be formed simultaneously with driving gate electrode G1 such that the gate line G overlaps at least a portion of the semiconductor piece A. Respective materials of the driving gate electrode G1 and the gate line G may include at least one selected from Mo, Al, Pt, Pd, Ag, Mg, Au, Ni, Nd, Ir, Cr, Li, Ca, Ti, W, and Cu.

The edge 10 (FIG. 3) of the gate line G may be stair shaped based on the semiconductor piece A located under the gate line G1.

Next, the driving drain electrode S1 and the driving drain electrode D1 may be formed by injecting impurities into both ends of the driving semiconductor layer A1 by using the driving gate electrode G1 as a mask. When a group III dopant such as boron (B) is injected as an impurity, the driving semiconductor layer A1 has p-type conductivity. When a group V dopant such as phosphorous (P), arsenic (As), or antimony (Sb) may be used as an impurity, the driving semiconductor layer A1 has n-type conductivity.

Referring to FIG. 6C, the wiring insulating layer 130 is formed over the entire surface of the substrate 100 to cover the gate line G.

The wiring insulating layer 130 may be formed as a single layer of an organic material or an inorganic material, or a stack thereof. In some embodiments, the wiring insulating layer 130 may be formed of $SiN_x$, $SiO_2$, $HfO_2$, or $Al_2O_3$. In some embodiments, the wiring insulating layer 130 may have a dual structure of $SiO_x/SiN_y$ or $SiN_x/SiO_y$. The wiring insulating layer 130 may be formed by using various deposition methods, such as sputtering, CVD, or PECVD.

The wiring insulating layer 130 may be formed as stairs that gradually increase in height according to the semiconductor piece A located under the edge 10 of the gate line G The source or data line SD may be formed on the wiring insulating layer 130 to intersect with the gate line G. Similar to the wiring insulating layer 130, steps may also be formed in the source or data line SD according to the semiconductor piece A.

Therefore, since the steps gradually increase in height, a wiring defect due to the steps may be reduced or minimized.

As described above, according to the one or more of the above embodiments, semiconductor pieces, which are irrelevant to a TFT, are formed at intersections of wirings so that a step coverage problem may be reduced or minimized.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A thin film transistor (TFT) circuit device comprising:
a substrate;
a gate line formed over the substrate and extending in a first direction;
an insulating layer formed over the gate line;
an electrically conductive line formed over the insulating layer and extending in a second direction, the second direction being different from the first direction, the electrically conductive line comprising a source line or a data line; and
a semiconductor piece formed over the substrate, the semiconductor piece comprising a portion which is located between the substrate and the gate line and overlaps the gate line and the electrically conductive line at an intersection of the gate line and the electrically conductive line, wherein the semiconductor piece does not contact the electrically conductive line,
wherein the gate line and the conductive line are electrically insulated by the insulating layer and at least partially overlap each other in the depth dimension of the TFT circuit device.

2. The device of claim 1, further comprising a gate insulating layer located between the semiconductor piece and the gate line.

3. The device of claim 1, wherein the gate line comprises an edge overlapping the electrically conductive line in the depth dimension of the TFT circuit device, wherein the edge of the gate line overlaps the semiconductor piece in the depth dimension of the TFT circuit device.

4. The device of claim 3, wherein the semiconductor piece comprises two edges overlapping the electrically conductive line in the depth dimension of the TFT circuit device, and wherein the edge of the gate line is located between the two edges of the semiconductor piece in the depth dimension of the TFT circuit device.

5. The device of claim 3, wherein the semiconductor piece comprises another portion that overlaps the electrically conductive line and does not overlap the gate line.

6. The device of claim 5, wherein the electrically conductive line comprises a stepped portion generally conforming to a stepped structure formed by the gate line and the semiconductor piece.

7. The device of claim 1, wherein the gate line comprises two edges overlapping the electrically conductive line in the depth dimension of the TFT circuit device, and wherein the two edges overlap the semiconductor piece in the depth dimension of the TFT circuit device.

8. The device of claim 1, wherein the semiconductor piece is formed under the gate line, and has a width is substantially greater than that of the gate line.

9. The device of claim 1, wherein the semiconductor piece is formed of polysilicon.

10. The device of claim 1, further comprising a semiconductor layer portion at least partially doped with impurities for providing source and drain areas of a TFT.

11. The device of claim 10, wherein the semiconductor piece is formed of a material the same as that of the semiconductor layer portion and does not comprise a portion doped with the impurities, and wherein the semiconductor piece is not electrically connected to the semiconductor layer portion.

12. The device of claim 1, wherein the semiconductor piece has a thickness substantially smaller than that of the gate line.

13. The device of claim 1, wherein the semiconductor piece is insulated from the gate line and the electrically conductive line.

14. The device of claim 1, wherein the insulating layer directly contacts the semiconductor piece.

15. The device of claim 1, wherein the gate line directly contacts the insulating layer.

16. The device of claim 1, wherein the semiconductor piece only partially overlaps the gate line.

17. The device of claim 1, wherein the gate line at least partially surrounds both a top surface and a side surface of the semiconductor piece.

18. The device of claim 1, wherein the gate line has a step shape.

19. The device of claim 1, wherein the conductive line includes step-shaped portions.

20. The device of claim 1, wherein the insulating layer is vertically interposed between the gate line and the conductive line.

* * * * *